United States Patent
Pau et al.

(10) Patent No.: US 7,780,813 B2
(45) Date of Patent: Aug. 24, 2010

(54) ELECTRIC FIELD MEDIATED CHEMICAL REACTORS

(75) Inventors: Stanley Pau, Tucson, AZ (US); Donald Milan Tennant, Gillette, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 1056 days.

(21) Appl. No.: 11/148,549

(22) Filed: Jun. 9, 2005

(65) Prior Publication Data

US 2007/0000613 A1    Jan. 4, 2007

(51) Int. Cl.
*C23F 1/00* (2006.01)
*H01L 21/306* (2006.01)

(52) U.S. Cl. .................................. 156/345.43
(58) Field of Classification Search ............. 156/345.43
See application file for complete search history.

(56) References Cited

U.S. PATENT DOCUMENTS

| | | | |
|---|---|---|---|
| 4,553,243 A | 11/1985 | Rosenwaks et al. | 372/89 |
| 4,653,062 A | 3/1987 | Davis et al. | 372/89 |
| 5,378,449 A | 1/1995 | Dinges | 423/579 |
| 5,589,136 A | 12/1996 | Northrup et al. | 422/102 |
| 5,858,192 A * | 1/1999 | Becker et al. | 204/547 |
| 5,870,422 A | 2/1999 | Florentino et al. | 372/89 |
| 5,974,072 A | 10/1999 | Hartlove et al. | 372/89 |
| 6,099,805 A | 8/2000 | Hartlove | 422/122 |
| 6,154,478 A | 11/2000 | Vetrovec | 372/89 |
| 6,224,786 B1 | 5/2001 | Stelman | 252/183.14 |
| 6,352,838 B1 | 3/2002 | Krulevitch et al. | 435/34 |
| 6,377,600 B1 | 4/2002 | Flegal | 372/89 |
| 2004/0063210 A1 * | 4/2004 | Steichen et al. | 436/55 |
| 2004/0077074 A1 * | 4/2004 | Ackley et al. | 435/287.2 |
| 2004/0105789 A1 * | 6/2004 | Yamamoto | 422/130 |

FOREIGN PATENT DOCUMENTS

| | | |
|---|---|---|
| EP | 0 599 248 A1 | 6/1994 |
| EP | 0 891 022 A1 | 1/1999 |
| EP | 0 891 025 A2 | 1/1999 |
| EP | 0 893 704 A2 | 1/1999 |
| EP | 1 059 709 A2 | 12/2000 |
| WO | WO 80/00922 | 5/1980 |

(Continued)

OTHER PUBLICATIONS

Luciferin, D., "*Luminescence Analysis*," Biothema, published by (www.biothema.com/luminescenceanalysis), Sep. 2002, p. 1.

(Continued)

*Primary Examiner*—Michael Cleveland
*Assistant Examiner*—Keath T Chen
(74) *Attorney, Agent, or Firm*—Hitt Gaines, PC

(57) ABSTRACT

A chemical reactor includes two or more substrates joined along planar surfaces thereof, a chemical reaction chamber located between the two or more substrates, and a pair of electrodes on one of the substrates and along a wall of the reaction chamber. Each substrate is a substantially dielectric or semiconductor substrate. The chemical reaction chamber has a hollow interior, one or more input ports to transport a gas into the hollow interior, and an output port to transport a byproduct out of the hollow interior.

13 Claims, 8 Drawing Sheets

FOREIGN PATENT DOCUMENTS

| WO | WO 90/07810 | 7/1990 |
| WO | WO 90/08414 | 7/1990 |
| WO | WO 97/00726 | 1/1997 |

OTHER PUBLICATIONS

Online publication titled: "*An Introduction to Chemiluminescence and Bioluminescence Measurements*," by "Communication Technology"—www.comm-tec.com/library/ctd/chemiluminescenceandbioluminesance measurements) (dated prior to Apr. 8, 2003, pp. 1-11.

Wako, Tecan, Application Note: "*Performance of a typical luminescence application demonstrated on two examples of Firefly Luciferase Assays*," (Firefly Luciferase Assay, Doc. 391 551), Nov. 2000, pp. 1-4.

Wood, K.V., Lam, Y.A., Seliger, H.H., McElroy, W.D., "*Complementary DNA Coding Click Beetle Luciferases Can Elicit Bioluminescence of Difference Colors*," Science, vol. 244, May 1989, pp. 700-702.

Cool, T.A., Falk, T.J., Stephens, R.R., "*DF-$CO_2$ and HF-$CO_2$ Continuous-Wave Chemical Lasers*," Applied Physics Letters, vol. 15, No. 10, Nov. 15, 1969, pp. 318-320.

White, E.H., Steinmetz, M.G., Miano, J.D., Wildes, P.D. and Morland, R., "*Chemi-and Bioluminescence of Firefly Luciferin*," Journal of the American Chemical Society, Apr. 23, 1980, pp. 3199-3208.

"*Reactions of Alkanes*," Chemical Reactivity, http://cem.msu.edu/-reusch/VirtualText/funerx1.htm, (Apr. 23, 2003), p. 1-4.

Gomi, K. and Kajiyama, N., "*Oxyluciferin, a Luminescense Product of Firefly Luciferase, Is Enzymatically Regenerated into Luciferin*," The Journal of Biological Chemistry, vol. 276, No. 39, Issue of Sep. 28, 2001, pp. 36508-36513.

U.S. Appl. No. 10/444,578, C. Pai, et al., filed May 23, 2003.

Harendt, C., et al., "Silicon fusion bonding and its characterization," J. Micromech. Microeng., vol. 2, pp. 113-116, 1992.

"Low temperature wafer anodic bonding", by J. Wei et al., J. Micromech. Microeng., Vo. 13 (2003) pp. 217-222.

\* cited by examiner

ELECTRIC FIELD MEDIATED CHEMICAL REACTORS

BACKGROUND

1. Field of the Invention

The invention relates to chemical reactors.

2. Discussion of the Related Art

A chemical reactor includes a substantially closed chemical reaction chamber (CRC) where a chemical reaction occurs under controlled conditions. The CRC typically regulates reaction conditions in a manner that controls the production of byproducts. Regulating the reaction conditions may enable control of the reaction rate. Regulating the reaction conditions may enable selection of specific reaction pathways when competing reaction pathways exist.

Various chemical reactors have used heaters, spark generators, or light sources to initiate chemical reactions therein. Using a heater or spark generator as a reaction initiator provides some control over chemical reaction rates. Nevertheless, such initiators typically provide less control over the selection of a specific chemical reaction pathway when several pathways compete for available reactant molecules. Using a light source as a reaction initiator can improve the selectivity for specific reaction pathways, but suitable light sources are often expensive. For example, adding a monochromatic laser source to a chemical reactor may significantly increase the price of the chemical reactor.

BRIEF SUMMARY

Some embodiments provide chemical reactors configured to produce electric fields of high intensity for stimulating chemical reactions therein. The chemical reactors include structures that are fabricated to produce electric fields of high intensity without causing sparking or electrical arcing. In some embodiments, the electric fields of high intensity may be used to select specific reaction pathways in a chemical reactor.

One embodiment features a chemical reactor that includes two or more substrates joined along planar surfaces thereof, a chemical reaction chamber located between the two or more substrates, and a pair of electrodes on one of the substrates and along a wall of the reaction chamber. Each substrate is a substantially dielectric or semiconductor substrate. The chemical reaction chamber has a hollow interior, one or more input ports to transport a gas into the hollow interior, and an output port to transport a byproduct out of the hollow interior.

Another embodiment features a process for operating a chemical reactor. The process includes flowing a gas into a chemical reaction chamber formed between two planar substrates and producing a voltage across a pair of electrodes to generate an electric field in the chamber such that the field stimulates a chemical reaction in the flowing gas located in the chamber. The substrates are dielectric and/or semiconductor substrates. The electrodes are located between the substrates and are configured to impede electrical arcing in the gas in response to the act of producing.

BRIEF DESCRIPTION OF THE DRAWINGS

In the figures and description herein, the use of the same reference numerals indicates elements having similar functions.

In the figures, the dimensions of some features may be exaggerated relative to others for the purpose of better illustrating the embodiments.

DETAILED DESCRIPTION OF ILLUSTRATIVE EMBODIMENTS

Figure 1:
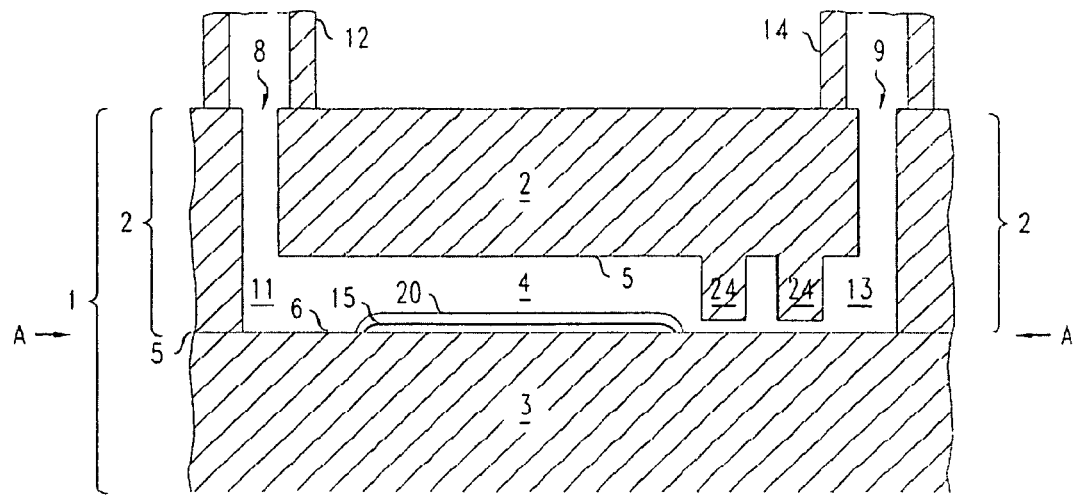
FIG. 1 is a vertical cross-section through a micro-chemical reactor (MCR) that is controlled by electric fields therein.

FIGS. 1 shows one embodiment of an electric field-controlled micro-chemical reactor (MCR) 1. The MCR 1 includes two or more adjacent planar substrates 2, 3. The planar substrates 2, 3 are substantially formed of inorganic dielectric, e.g., borosilicate glass, and/or inorganic semiconductor, e.g., silicon. The planar substrates 2, 3 have surfaces 5, 6 that form a hollow chemical reaction cavity (CRC) 4 between the substrates 2, 3. In particular, the CRC 4 is formed by walls of a trench along the bottom of the top substrate 2 and adjacent portions of the top surface 6 of the bottom substrate 3. The substrates 2, 3 have continuous contact regions that close lateral edges of the CRC 4 at the interface between the surfaces 5, 6. Exemplary CRC 4 have widths and heights in the range of 30 microns (μm) to 300 μm. These small widths and heights enable such exemplary CRCs 4 to perform chemical reactions on small quantities of reactant molecules.

In the MCR 1, a plurality of channels 8, 9 vertically traverse the entire thickness of the planar substrate 2. The channels 8 function as input ports to a first end 11 of the CRC 4. The channels 8 enable pumping gases carrying chemical reactants into the first end(s) 11 of the CRC 4, e.g., from delivery tubes 12 sealed to the external orifices of the channels 8. The channel 9 functions as an output port from the second end 13 of the CRC 4. The channel 9 enables the removal of gases and/or liquids containing reaction byproducts from the second end 13 of the CRC 4. For example, the removal is via an extraction tube 14 that seals around the external orifice of the channel 9.

Figure 2:
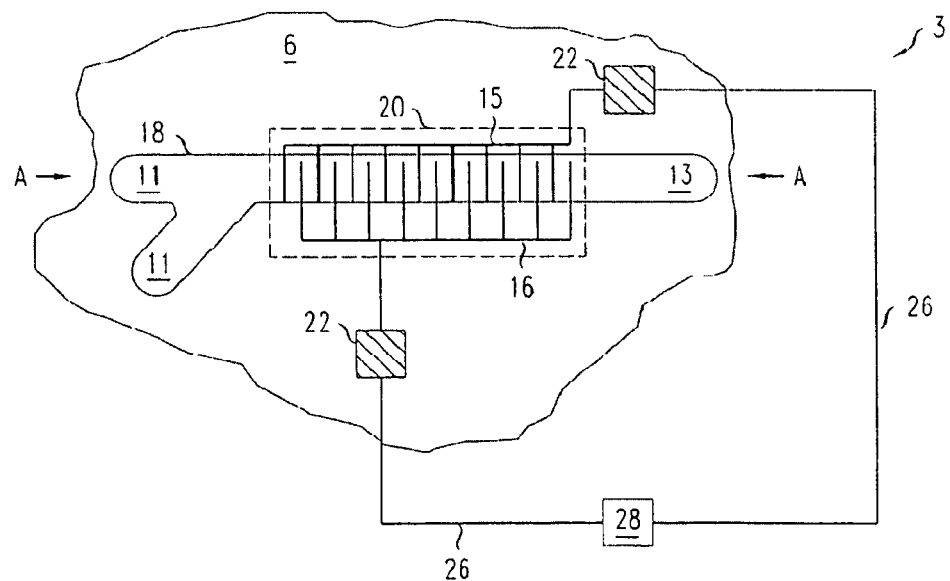
FIG. 2 is a top view of the planar top surface of one substrate in an embodiment of the electric field-controlled MCR of FIG. 1.

FIG. 2 shows part of the top surface 6 of the substrate 3 for one embodiment of the MCR 1 of FIG. 1. The shown portion of the top surface 6 includes the bottom wall of the CRC 4. A line 18 illustrates the location and shape of the CRC 4 that is directly over the shown portion of the top surface 6. The line 18 shows the cross-sectional shape of the CRC 4. The line 18 also shows the placements of the first and second ends 11, 13 of the CRC 4.

FIG. 2 also illustrates paired metallic electrodes 15, 16 that are located on the top surface 6 of the substrate 3. The metallic electrodes 15, 16 have inter-digitized and closely spaced members that form a dense covering over a contiguous region of the bottom wall of the CRC 4. Exemplary members of the metallic electrodes 15, 16 have widths and thicknesses of about 0.1 micrometers ($\mu m$) to 1.0 $\mu m$ and may include platinum, tungsten, copper, gold, aluminum, and/or silver. In exemplary embodiments, the members of the electrode 15 are separated from neighboring members of the electrode 16 by about 0.1 $\mu m$ to 1.0 $\mu m$. A continuous dielectric layer 20 also covers the members of the metallic electrodes 15, 16. An exemplary dielectric layer 20 includes silicon dioxide, silicon nitride, sputtered diamond, or aluminum nitride. The metallic electrodes 15, 16 include contact pads 22 that are not covered by the dielectric layer 20. The contact pads 22 are exposed areas of the MCR 1. The contact pads 22 provide accesses for conducting wires 26 that connect an AC or DC voltage source 28 across the metallic electrodes 15, 16 during operation of the MCR 1. The contact pads 22 are accessible through vias or windows that traverse the entire thickness of the top substrate 2. The voltage source 28 may be frequency, amplitude, and phase tunable.

Due to the small spacing between neighboring members of the metallic electrodes 15, 16, small-applied electric potential differences can produce electric fields of high-intensity near said members. Applied electric potential differences of about 1-10 volts may, e.g., produce electric fields with maximum magnitudes of 500,000 or more volts per meter (V/m) or 1,000,000 or more V/m in part of the gas flowing through the CRC 4. For example, maximum magnitudes of such electric fields may be in the range of about 1,000,000 to 10,000,000 V/m. During the application of voltages across the metallic electrodes 15, 16, the dielectric layer 20 functions as electrical insulation between neighboring members of the metallic electrodes 15, 16. In particular, the dielectric layer 20 lowers the likelihood of electrical arcing and/or spark generation in the gas that flows in the CRC 4 near the metallic electrodes 15, 16.

The metallic electrodes 15, 16 are located along and near the bottom wall of the CRC 4. For that reason, the metallic electrodes 15, 16 are able to create electric fields of high intensity inside the hollow interior of the CRC 4. Nevertheless, the high intensity regions for the electric fields are typically localized near the metallic electrodes 15, 16. For that reason, the CRC 4 typically only subjects a thin layer of gas that passes near the electrodes 15, 16 to electric fields of high intensity. To avoid having the electric fields stimulate chemical reactions in only this thin gas layer, the MCR 1 may be configured to mix the gas or gases flowing through the CRC 4. For example, the CRC 4 may have a pattern of raised flow obstructions 24 located along one or both of the surfaces 2, 3. The flow obstructions 24 cause mixing of the gas or gases by disrupting smooth flows in the CRC 4. Exemplary flow obstructions 24 may be located before and/or after the location of the metallic electrodes 15, 16 along the gas flow path in the CRC 4. The flow obstructions 24 have heights and widths that are fixed by the desired amount of mixing, the gas viscosity, and desired flow rate in the CRC 4.

Figure 3:
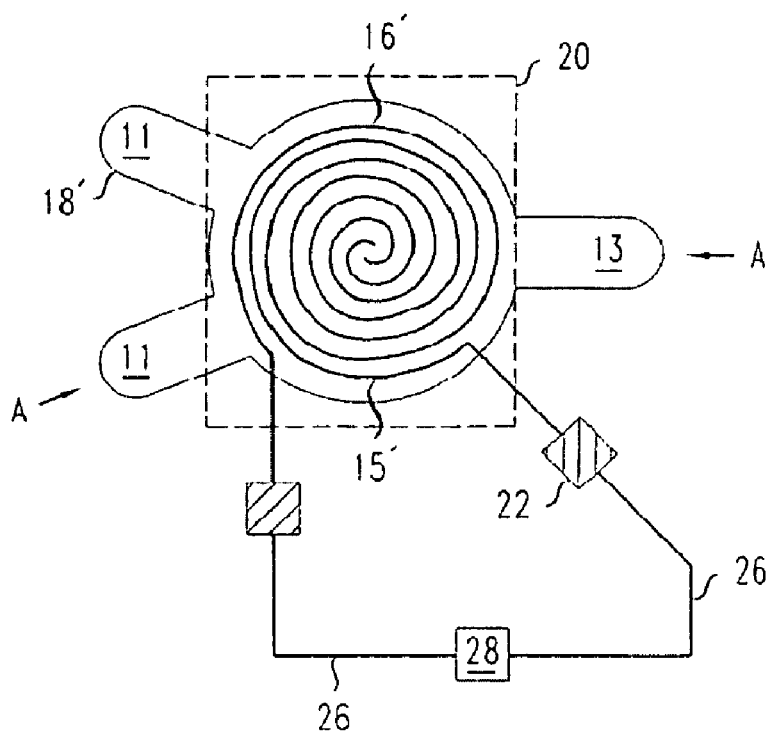
FIG. 3 is a top view of the planar top surface of one substrate in an alternate embodiment of the electric field-controlled MCR of FIG. 1.

FIG. 3 shows the top surface 6 of the bottom substrate 3 in an alternate embodiment of the MCR 1. In this embodiment, the MCR 1 is again formed from the two planar substrates 2, 3 and includes a CRC 4 located between the substrates 2, 3 as shown in FIG. 1. In addition, the CRC 4 has input ports 8 for gases containing chemical reactants and an output port 9 for reaction byproducts. The CRC 4 also includes a pair of interleaved metallic electrodes 15', 16' located along the top surface 6 of the bottom substrate 3. The interleaved portions of the metallic electrodes 15', 16' are located along the bottom wall of the CRC 4. Exemplary interleaved portions of the metallic electrodes 15', 16' have widths and thicknesses of about 0.1 micrometers ($\mu un$) to 1.0 pin. An exemplary spacing between the adjacent spirals of the interleaved portions of the metallic electrodes 15', 16' is about 0.1 $\mu m$ to 1.0 $\mu m$ so that applied electric potentials of about 1-10 volts can produce strong electric fields near the electrodes 15', 16'. Also, the electrodes 15', 16' are covered by a dielectric layer 20 to impede electrical arcing in the gas flowing in the CRC 4 during operation of the MCR 1.

Referring to FIG. 3, the line 18' indicates the shape and position of the edge of the bottom wall of the CRC 4 in this alternate embodiment of the MCR 1 of FIG. 1. In this embodiment, the CRC 4 has a cylindrical central cavity in which the metallic electrodes 15, 16 form interleaved spirals. The CRC 4 has first and second ends 11, 13 that connect to edges of its cylindrical central cavity. Thus, the shape of the CRC 4 and the shape of the metallic electrodes 15', 16' in the embodiment of FIG. 3 differ from the shape of the CRC 4 and the shape of the metallic electrodes 15, 16 in the embodiment of FIG. 2.

Referring to FIGS. 1-3, some embodiments of the MCR 1 are configured to support chemically catalyzed reactions. In these embodiments, a chemical catalyst is either transported in the gas carrying reactant molecules or is bound to one or more internal wall of the CRC 4. For example, the chemical catalyst may be a platinum layer that covers an exposed portion of the surfaces 5, 6 of the top and bottom substrates 2, 3 or an exposed portion of the dielectric layer 20. The chemical catalyst may also be bound to exposed surfaces of the flow obstructions 24 in the CRC 4.

In some embodiments, the voltage source 28 near-resonantly drives the metallic electrodes 15, 16 during operation of the MCR 1. In particular, the metallic electrodes 15, 16 are part of an RLC circuit driven by the voltage source 28. In these embodiments, the voltage source 28 is an AC voltage source whose frequency is set to drive the RLC circuit under near-resonant conditions. For example, the AC voltage source may drive the RLC circuit at a frequency that differs from the circuit's resonant driving frequency by less than the half-width at half-maximum for the voltage-frequency response curve across the metallic electrodes 15, 16. Near-resonant driving can aid to produce electric fields of high intensity in the interior of the CRC 4.

In some embodiments, the voltage source 28 includes a device for monitoring the impedance or capacitance of the lumped device that is formed by the metallic electrodes 15, 16 and interposed dielectric. This impedance or capacitance generally depends on the condition of the gas flowing through the CRC 4. Thus, monitoring of this impedance or capacitance may provide information on chemical reactions in the CRC 4. Embodiments of the voltage source 28 may include a feedback loop that adjusts the MCR 1 based on a measurement by a device in the voltage source 28 of an electrical quantity indicative of the impedance or capacitance across the metallic electrodes 15, 16. The feedback loop may be configured to dynamically adjust the gas flow rate in the CRC 4 or to dynamically adjust the voltage applied across the metallic electrodes 15, 16 in response to the measured value of the electrical quantity indicative of this impedance or capacitance.

Figure 4:
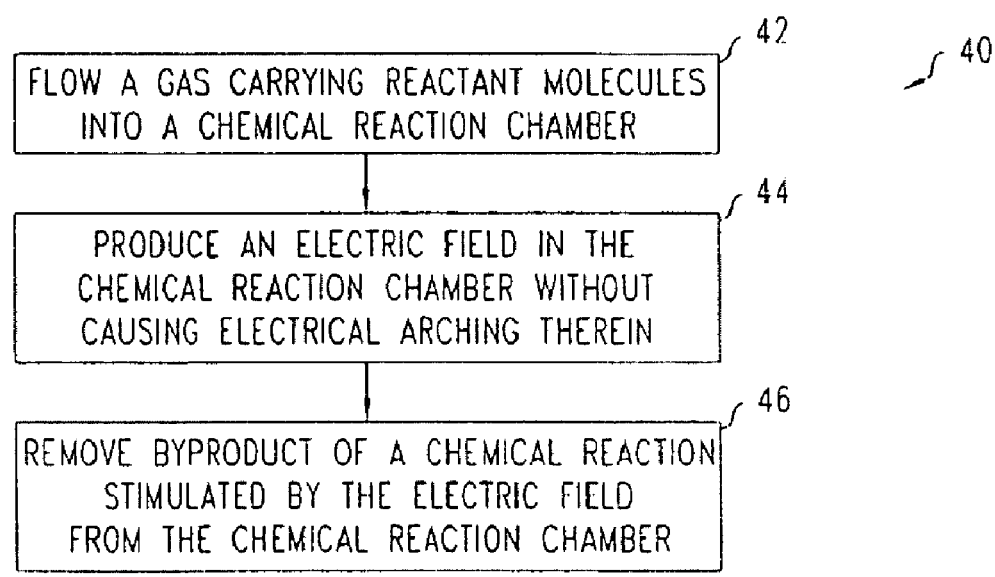
FIG. 4 is a flow chart for a method of operating an electric field-controlled MCR, e.g., the MCRs illustrated in FIGS. 1-3.

FIG. 4 illustrates a method 40 of operating an electric field-controlled MCR, e.g., the MCRs of FIGS. 1-3. The MCR includes a hollow CRC, e.g., CRC 4, and two or more closely spaced metallic electrodes therein, e.g., the metallic electrodes 15, 16. The metallic electrodes are covered by a dielectric layer, e.g., the dielectric layer 20 that impedes electric fields of high intensity from causing electrical arcing in gas near the metallic electrodes.

The method 40 includes flowing a gas into the CRC, wherein the gas includes one or more species of chemically reactant molecules (step 42).

The method 40 also includes stimulating a chemical reaction in the flowing gas by applying an AC or DC voltage across the metallic electrodes (step 44). The applied voltage produces an electric field of high intensity in a region of the hollow CRC. In that region, the magnitude of the electric field may have a magnitude greater than 500,000 V/m, e.g., the magnitude may be in the range of about 1,000,000 V/m to about 10,000,000 V/m.

The metallic electrodes form part of an RLC circuit that may be driven under near-resonance conditions in some embodiments. In particular, an AC voltage may drive the RLC circuit at a frequency that differs from the circuit's resonant driving frequency by less than the half-width at half-maximum for voltage-frequency response curve across the metallic electrodes. Such near-resonant driving can contribute to the production of electric fields of high intensity in the CRC. The voltage may alternatively drive the metallic electrodes at or near the plasma frequency for the gas flowing through the CRC.

In the CRC, the produced electric field generates highly reactive chemical species such as ions or free radicals in the gas subjected to the electric field of high intensity. Such ions or free radicals may function as catalysts for chemical reactions. Nevertheless, the molecular diffusion lengths for such reactive species may be small in the flowing gas. For that reason, the step 44 may include mixing the gas flowing in the CRC to disperse the ions or free radicals in the portion of the gas not subjected to electric fields of high intensity. To produce the mixing, the method may include flowing the gas through an array of flow obstructions, e.g., the flow obstructions 24, to disrupt laminar flow of the gas layer passing closest to the metallic electrodes.

The method 40 includes extracting gaseous or liquid byproducts of the chemical reaction from the CRC (step 46). The extracting step may involve collecting byproducts that are ejected from an output port of the CRC, e.g., the output port 9.

Figure 5:
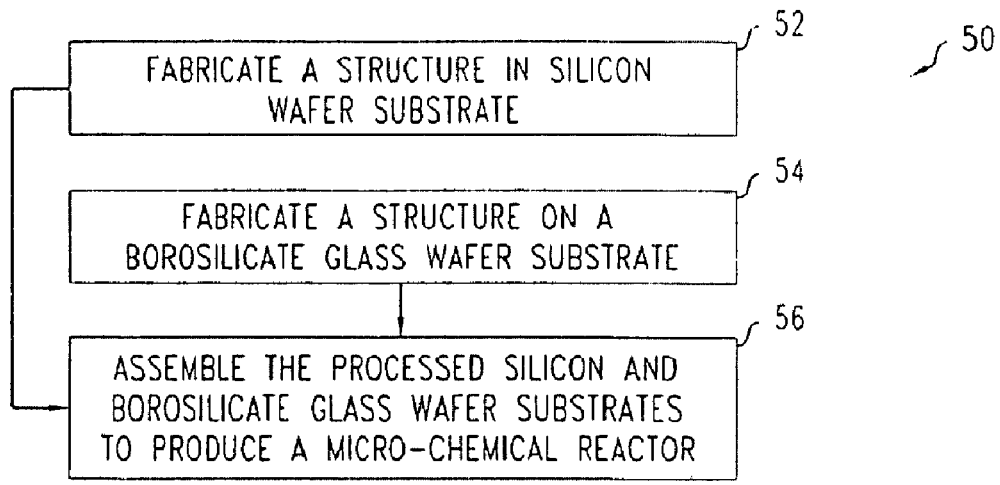
FIG. 5 is a flow chart for a method of fabricating an embodiment of the electric field-controlled MCR illustrated in FIG. 1.
Figure 7:
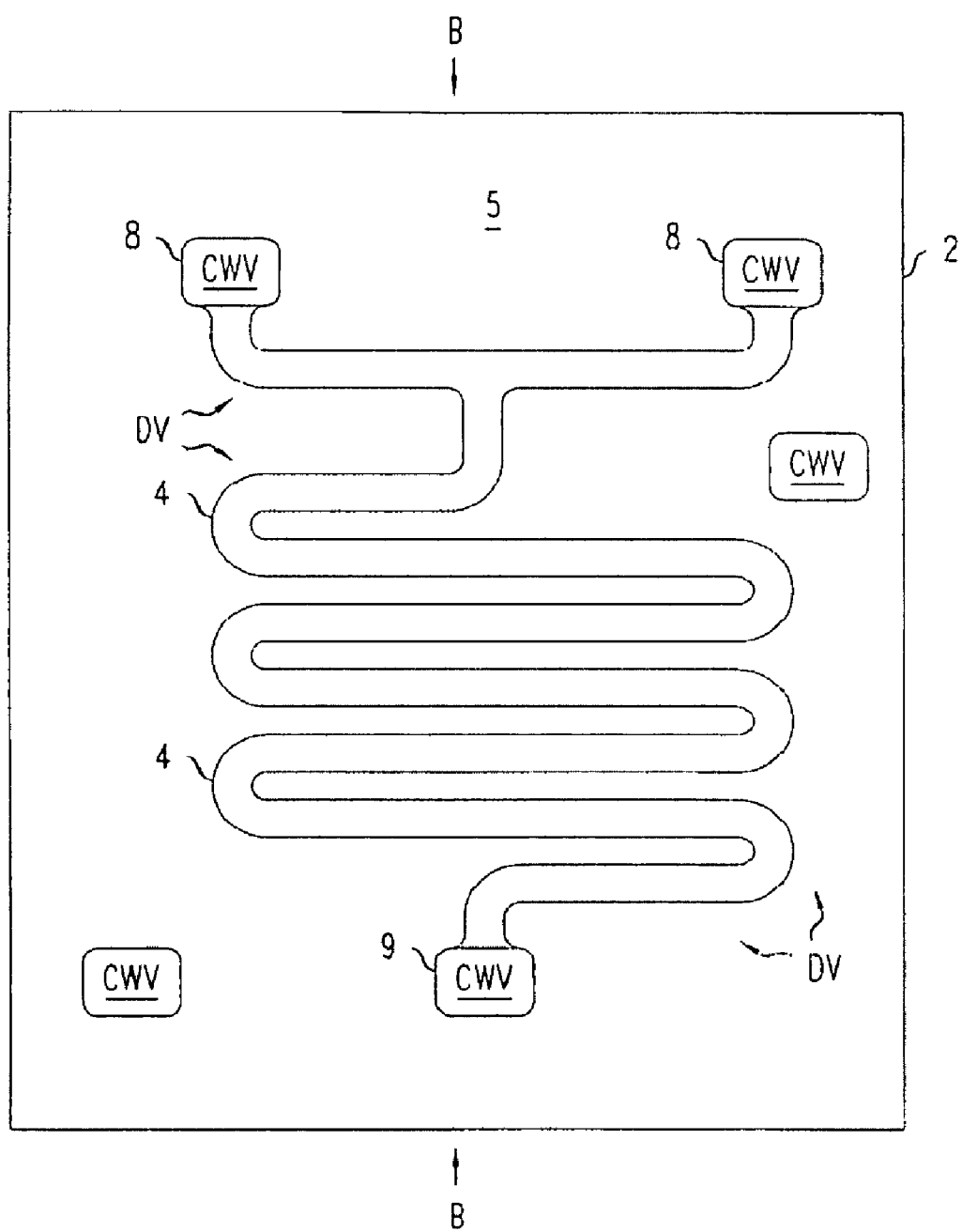
FIG. 7 is a top view of one surface of the processed silicon wafer substrate produced by the step of FIG. 6A.
Figure 8:
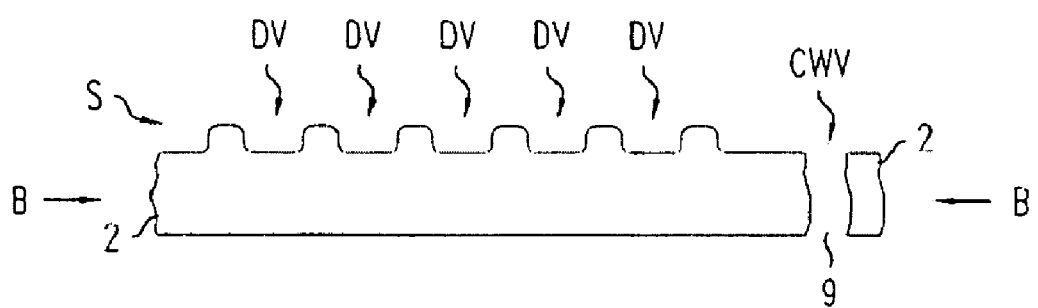
FIG. 8 is a cross-sectional view through the processed silicon wafer substrate produced by the step of FIG. 6A.
Figure 10:
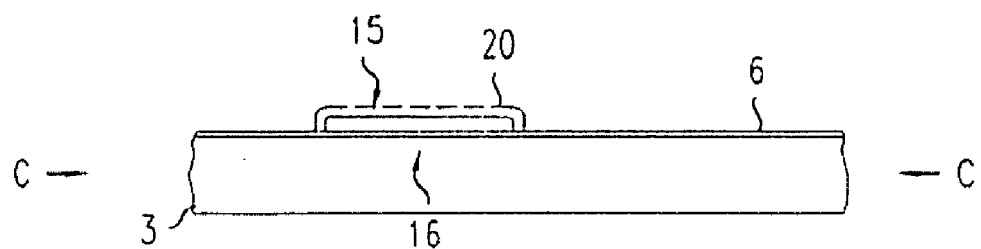
FIG. 10 is a cross-sectional view of the processed borosilicate glass substrate produced by the step of FIG. 6B.
Figure 9:
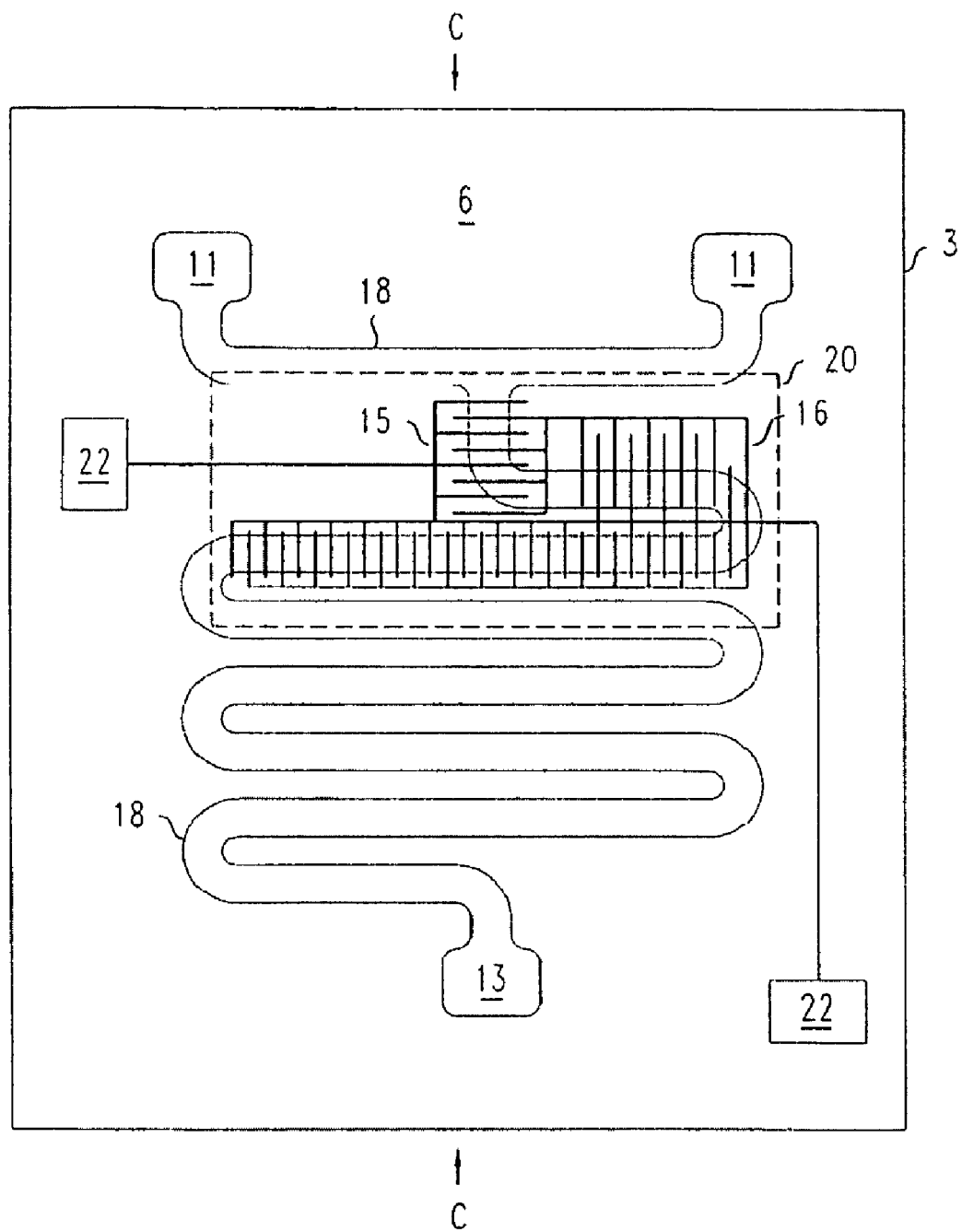
FIG. 9 is a top view of one surface of the processed borosilicate glass substrate produced by the step of FIG. 6B.

Conventional microelectronics fabrication techniques are available to fabricate an embodiment of the MCR 1 illustrated in FIG. 1. FIG. 5 illustrates an exemplary fabrication method 50 that involves three steps. One step involves fabricating a structure in a portion of silicon wafer substrate to produce the processed silicon wafer substrate 2 as shown in FIGS. 7-8 (step 52). Another step involves fabricating a structure on a corresponding portion of a borosilicate glass wafer substrate 3 to produce the processed borosilicate glass substrate 3 as shown in FIGS. 9-10 (step 54). A third step involves assembling the processed silicon and borosilicate glass wafer substrates 2, 3 to fabricate the MCR 1 (step 56). Each of the processed wafer substrates 2, 3 includes a portion of the CRC 4. The assembling step involves first, aligning corresponding portions of the processed wafer substrates 2, 3 to appropriately position the metallic electrodes 15, 16 and then, joining the aligned processed wafer substrates 2, 3.

The starting silicon and borosilicate glass wafer substrates are available from a variety of commercial sources. Suitable silicon wafer substrates include conventional silicon wafers that are readily available from commercial sources well-known to those of skill in the art. The borosilicate glass wafer substrate is made of a temperature resistant glass that does not crack when heated to temperatures above 400° C. Preferably, the glass includes a significant density of incorporated sodium. Exemplary borosilicate glass wafer substrates have a composition of about 81% $SiO_2$, about 4.0% $Na_2O$, about 0.5% $K_2O$, about 0.5% 13.0% $B_2O_3$, and about 2.0% $Al_2O_3$. Borosilicate glass wafer substrates are sold by University Wafer, 66 N Street Unit #9, South Boston, Mass. 02127 USA and Prazisions Glas & Optik GmbH, Hegestuck 11 D-58640 Iserlohn, Germany.

Figure 6A:
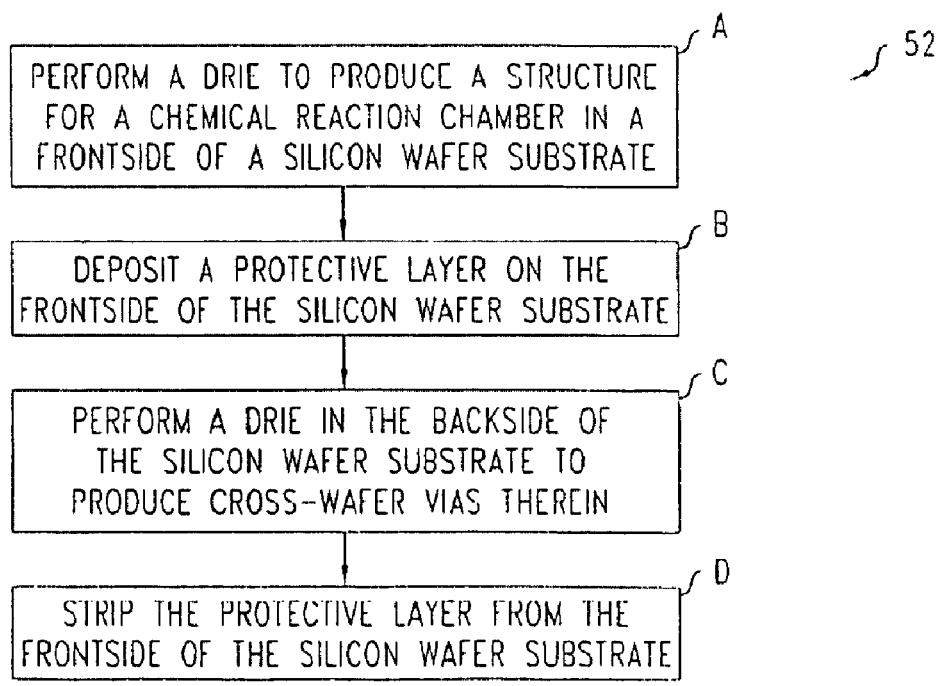
FIG. 6A is a flow chart illustrating the step of forming a structure on the silicon wafer substrate in the method of FIG. 5.

Referring to FIGS. 6A and 7-8, step 52 for producing a structure in a silicon wafer substrate includes performing a sequence of sub-steps A-D. The sub-step A involves performing a mask-controlled deep reactive ion etch (DRIE) to form a deep via or trench (DV) for the CRC 4 on the frontside of the silicon wafer substrate. Techniques for performing DRIEs in silicon wafers are well-known in the art. For example, DRIEs are described in U.S. Pat. No. 5,589,136 and U.S. patent application Ser. No. 10/444,578, which was filed May 23, 2003 by C. -S. Pai et al, this patent and patent application are incorporated herein by reference in their entirety. The DRIE may, e.g., be controlled by a hard mask formed of about 100 nm of aluminum nitride (AlN) on about 100 nm of silicon dioxide. Such a hard mask provides a high selectivity during the DRIE and is typically easy to remove from the silicon wafer substrate after the DRIE. The formation of the hard mask includes depositing the $SiO_2$ layer on the wafer substrate via a conventional TEOS-based process, forming the AlN layer on the deposited $SiO_2$, lithographically producing a resist mask on the AlN layer, dry etching the AlN and $SiO_2$ layers, and stripping off the resist mask. The sub-step B involves depositing a protective layer on the frontside of the silicon wafer substrate, e.g., a thick layer of photo resist and then, flipping the silicon wafer substrate and aligning its backside for subsequent processing. The sub-step C involves performing a mask-controlled backside DRIE of the silicon wafer substrate to produce cross-wafer vias (CWVs) therein. The backside DRIE may also be controlled by a hard mask of the type already described, i.e., a mask formed by an AlN layer on a $SiO_2$ layer. Some of the cross-wafer visa (CWVs) provide the input ports 8 and output port 9 to the CRC 4. Others of the cross-wafer vias (CWVs) are windows that will provide electrical access to the contact pads 22 of the metallic electrodes 15, 16 located on the processed borosilicate glass wafer substrate 3. The sub-step D also involves stripping away the protective resist layer from the finally processed silicon wafer substrate 2 via a conventional process, e.g., a reactive ion etch or a wet etch with HF.

In some embodiments, the cross-wafer vias (CVWs) may be fabricated prior to fabrication the trench for the CRC 4, e.g., by inverting the order of sub-steps A and C and depositing the protective layer on the frontside of the silicon wafer substrate the at sub-step B.

Figure 6B:
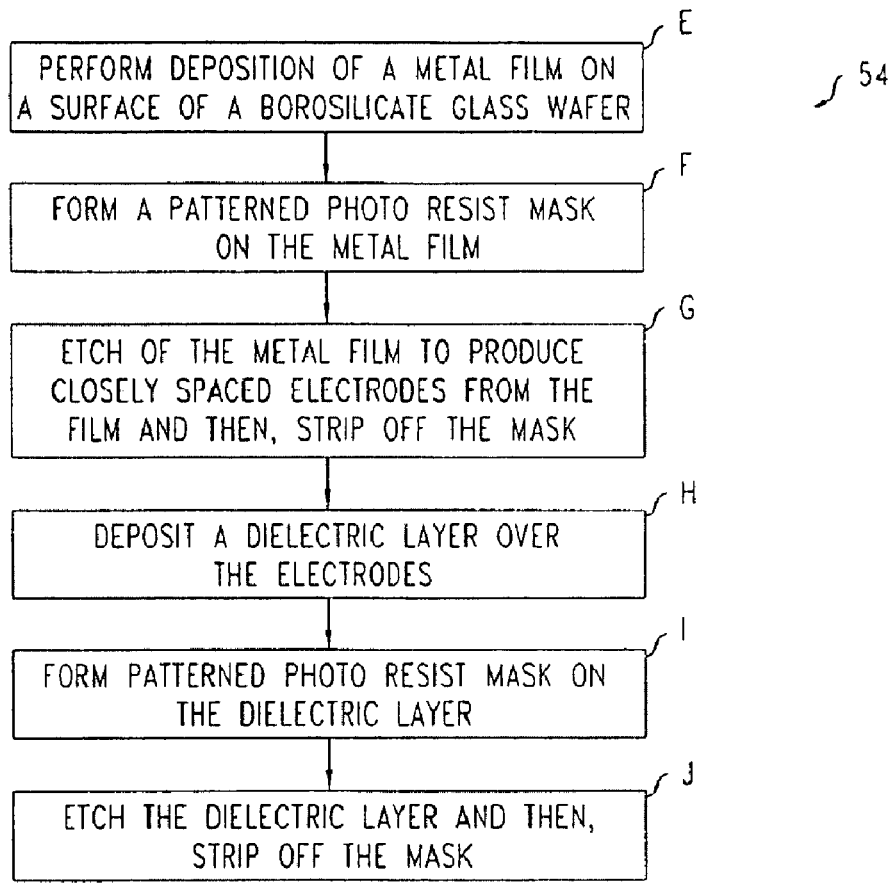
FIG. 6B is a flow chart illustrating the step of forming a structure on the borosilicate glass wafer substrate in the method of FIG. 5.

Referring to FIGS. 6B and 9-10, the step 54 for fabricating the structure on the borosilicate glass wafer substrate also involves a sequence of sub-steps E-J. The sub-step E involves performing a conventional metal deposition to produce a film of about 100-1,000 nanometers (nm) of metal on the planar top surface 6 of the borosilicate glass wafer. The metal film includes, e.g., platinum, tungsten, copper, gold, aluminum, and/or silver. The sub-step F involves depositing on the metal film and then, lithographically patterning, and developing a layer of, at least, 300 nm of photo resist. The developed layer of photo resist forms a patterned protective mask for the metal film. The sub-step G involves performing a conventional dry or wet etch of the metal film and then, performing a conventional reactive ion etch (RIE) to strip off the photo resist mask. The etch produces interleaved metal electrodes 15, 16 on the top surface 6 of the borosilicate glass wafer, wherein the interleaved members of the electrodes 15, 16 are closely spaced to produce of electric fields of high intensity in response to applied electric potentials of about 1-10 volts. The sub-step H includes depositing a dielectric layer over the inter-digitized portions of the electrodes 15, 16. The sub-step 1 involves depositing, lithographically patterning, and developing a layer of photo resist on the dielectric layer. The developed photo resist is a patterned mask for controlling an etch of the dielectric layer. The sub-step J involves performing a conventional dry or wet etch to remove unprotected portions of the dielectric layer and then, stripping off the remainder of the photo resist mask. This etch forms the electrically insulating dielectric layer 20 on the electrodes 15, 16.

Figure 6C:
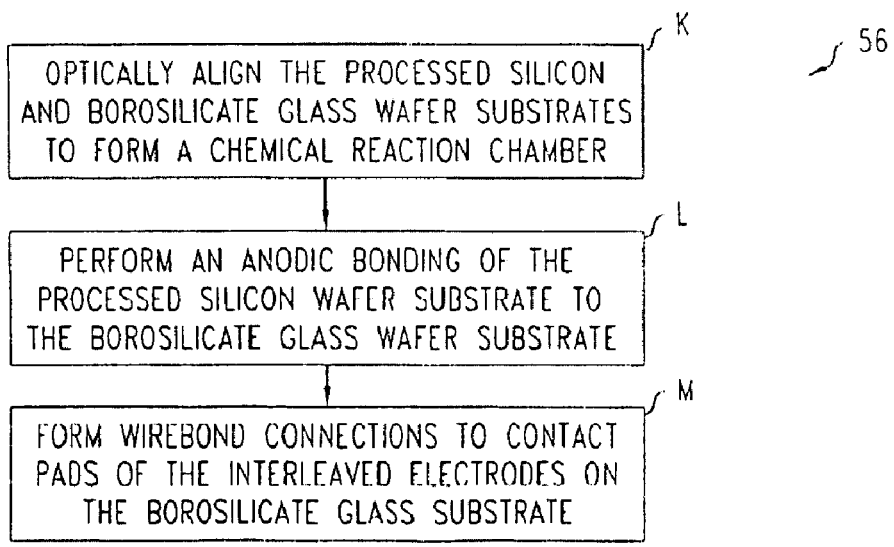
FIG. 6C is a flow chart illustrating the step of assembling the two substrates in the method of FIG. 5.

Referring to FIGS. 6C and 10, the step 56 of assembling the processed silicon and borosilicate glass wafer substrates 2, 3 involves performing a sequence of sub-steps K-M to produce the MCR 1 as shown in FIG. 1. The sub-step K involves optically aligning the processed silicon and silica glass wafer substrates 2, 3 such that the metallic electrodes 15, 16 are aligned to be located along the bottom of the via or trench for the CRC 4 and such that the contact pads of the electrodes 15, 16 are exposed through ones of the cross-wafer vias (CWVs) in the processed silicon wafer substrate 2. The alignment sub-step K may, e.g., use optical alignment marks on the processed silicon and borosilicate glass wafer substrates 2, 3. The alignment marks on the processed silicon wafer substrate 2 are viewed through the processed borosilicate glass wafer substrate 3 during the alignment step. The sub-step L involves performing an anodic bonding of the processed silicon and borosilicate glass wafer substrates 2, 3. In anodic bonding, the two processed wafer substrates 2, 3 are clamped and placed between metal anodizing electrodes. Then, a DC voltage of more than about 1000 volts is applied across the anodizing electrodes. The high applied voltage heats the portions of the surfaces of the wafer substrates 2, 3 that are in physical contact to about 450° C. or higher. Higher bonding temperatures may produce better bonding strengths, but the higher temperatures typically require special metals for the metallic electrodes 15, 16, e.g., tungsten and/or platinum. The high produced temperature displaces sodium ions from the contacting portions of the processed borosilicate glass wafer substrate 3 into the processed silicon wafer substrate 2. The displacement of sodium makes the borosilicate glass top surface 6 reactive thereby forming a chemical bond between the two processed wafer substrates 2, 3 after several minutes of heating, e.g., 2-10 minutes of heating at about 450° C. should suffice. The final sub-step M involves forming conventional wire bond connections to the pads 22 of the interleaved metallic electrodes 15, 16 through access windows, i.e., CWVs, in the processed silicon wafer substrate 2.

Figure 11:
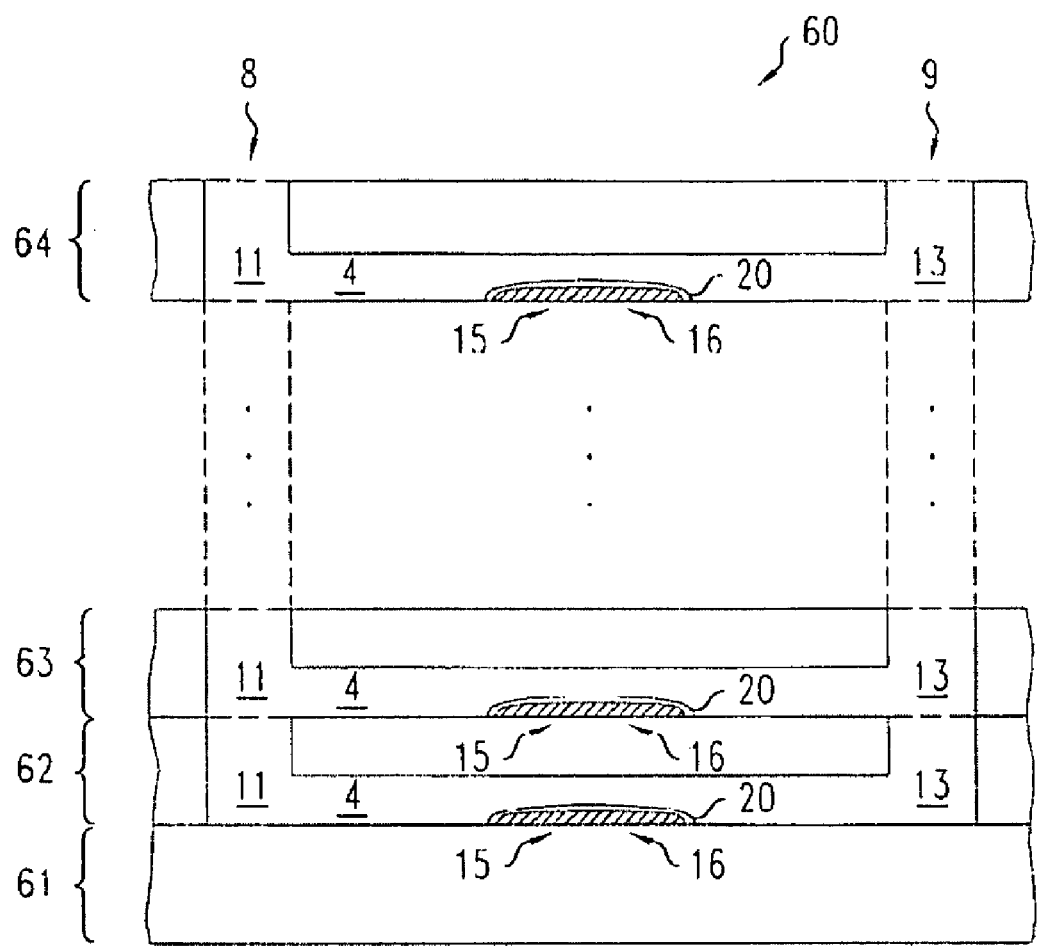
FIG. 11 is a cross-sectional view through a stacked structure that includes multiple CRCs therein.

FIG. 11 shows a stacked structure 60 that includes more than two planar wafer substrates and multiple CRCs 4. The stacked structure 60 includes a stack of processed silicon wafer substrates 61, 62, 63, . . . 64. At the interface between each adjacent pair of the silicon wafer substrates, i.e., pair (61, 62), pair (62, 63), etc., there is one CRC 4. Each CRC 4 includes a pair of interleaved and closely spaced metallic electrodes 15, 16, wherein thin insulating dielectric layers 20 cover the metallic electrodes 15, 16. The metallic electrodes 15, 16 are configured to produce electric fields of high intensity in the associated ones of the CRCs 4 in response to small applied electric potentials, e.g., a few volts. Each of the CRCs 4 is aligned to share the common gas input ports 8 and a common byproduct output port 9. The stacked structure 60 can provide an increased processing rate of a reactive gas over the processing rate obtainable in similar structures having only a single CRC therein, e.g., as in the MCRs 1 of FIGS. 1-3.

In light of the above-description of method 50, one of skill in the art would be able to easily fabricate the stacked structure 60 of FIG. 11. Exemplary fabrication methods for the stacked structure 60, involve first processing the silicon wafer substrates 61, 62, . . . 64 to produce trenches for the CRCs 4 and cross-wafer vias for the gas input ports and byproduct output port therein and also involve forming insulated pairs of metallic electrodes 15, 16 thereon. The fabrication methods also involve assembling the processed silicon wafer substrates 61, 62, . . . 64 to form the final stacked structure 60, wherein the assembling includes aligning and surface-joining the wafer substrates 61, 62, . . . 64. For the silicon wafer substrates 61, 62 . . . 64, the surface joining may be done by a fusion bonding process. In a fusion bonding process, a stack of silicon wafer substrates 61, 62, . . . 64 are brought into intimate contact by applying a high contact force to the stack. Once in intimate contact, Van der Waals forces should bond the processed silicon wafer substrates 61, 62, . . . 64 together firmly enough for handling. The bonded silicon wafers 61, 62, . . . should be annealed in a high temperature oven to produce a chemical bond between adjacent ones of the wafer substrates. A candidate anneal might be at about 1,000° C. for about 2 hours or at about 450° C. for much longer, e.g., 20 hours.

The fusion bond strength may also be improved by treating the processed silicon wafer substrates 61, 62, . . . 64 prior to performing the fusion bonding. A conventional treatment involves annealing silicon wafer substrates at about 450° C. for about 18 hours or at about 1000° C. for about 2 hours under a nitrogen atmosphere or annealing the silicon wafer substrates at 800° C. for about 30 minutes if they have p+ diffusion etch stop layers therein. Treatments for increasing fusion bonding strengths are, e.g., described in the article "Silicon fusion bonding and its characterization", by Christine Harendt et al, J. Micromech. Microeng. 2 (1992) pages 113-116. This article is incorporated by reference herein in its entirety.

Other embodiments of MCRs 1 may be formed using wafer substrates made from different dielectrics and/or semiconductors.

From the disclosure, drawings, and claims, other embodiments of the invention will be apparent to those skilled in the art.

What is claimed is:

1. A chemical reactor, comprising:
   two or more substrates joined along planar surfaces thereof, each substrate comprising dielectric or semiconductor;
   a chemical reaction chamber formed between the substrates, the chemical reaction chamber having a hollow interior and
   a pair of electrodes located on one of the substrates along a wall of the chamber, the chamber having one or more input ports to transport a gas into the hollow interior and an output port to transport a byproduct out of the hollow interior, and further comprising a chemical catalyst being on a portion of a wall of the chamber and being exposed to the hollow interior.

2. A chemical reactor, of claim 1: wherein the pair of electrodes are separated by about 0.1 to 1 microns.

3. The chemical reactor of claim 1, wherein the electrodes are insulated from the hollow interior by a dielectric coating.

4. The chemical reactor of claim 1, wherein the substrates are chemically bonded together along surfaces thereof.

5. The chemical reactor of claim 1, wherein the chamber comprises a plurality of physical flow obstructions positioned to cause a flowing gas to mix.

6. The chemical reactor of claim 1, wherein the reaction chamber is a planar structure.

7. The chemical reactor of claim 1, further comprising:
a third substrate being joined to a surface of a first of the two substrates and comprising dielectric or semiconductor, the first of the two substrates being located between the third substrate and the second of the two substrates; and
a second chemical reaction chamber being between the third substrate and the first of the two substrates and having a second hollow interior, a pair of electrodes being along a wall of the second chamber and on one of the third substrate and the first of the two substrates, the second chamber having an input port to transport a gas into the second interior and an output port to transport a byproduct out of the second interior.

8. The chemical reactor of claim 7, wherein the chemical reaction chamber and second chemical reaction chamber are stacked so as to share a common input port and a common output port.

9. The chemical reactor of claim 1, further comprising an AC voltage source connected across the electrodes and configured to drive the electrodes at a near-resonant frequency.

10. The chemical reactor of claim 1, further comprising an impedance monitor connected to monitor of the impedance of the electrodes.

11. The chemical reactor of claim 1, wherein the pair of electrodes are inter-digitized or interleaved with each other.

12. The chemical reactor of claim 1, wherein the pair of electrodes are part of an RLC circuit.

13. The chemical reactor of claim 1, wherein the chemical reaction chamber is configured to generate ions or free radicals in the gas.

* * * * *